United States Patent
Suzuki

(10) Patent No.: US 7,573,047 B2
(45) Date of Patent: Aug. 11, 2009

(54) WAFER HOLDER AND SAMPLE PRODUCING APPARATUS USING IT

(75) Inventor: Hiroyuki Suzuki, Chiba (JP)

(73) Assignee: SII NanoTechnology Inc., Chiba (JP)

( * ) Notice: Subject to any disclaimer, the term of this patent is extended or adjusted under 35 U.S.C. 154(b) by 373 days.

(21) Appl. No.: 11/712,011

(22) Filed: Feb. 28, 2007

(65) Prior Publication Data
US 2008/0073562 A1 Mar. 27, 2008

(30) Foreign Application Priority Data
Feb. 28, 2006 (JP) ............................. 2006-052601
Feb. 13, 2007 (JP) ............................. 2007-032609

(51) Int. Cl.
*G21K 5/08* (2006.01)
*G01N 13/12* (2006.01)

(52) U.S. Cl. .............................. 250/442.11; 250/440.11; 250/306; 250/307; 250/309; 250/310; 250/311; 250/492.1; 250/492.2; 250/492.21

(58) Field of Classification Search ............ 250/440.11, 250/441.11, 442.11, 306, 307, 309, 310, 250/311, 492.1, 492.2, 492.21
See application file for complete search history.

(56) References Cited

U.S. PATENT DOCUMENTS

| | | | |
|---|---|---|---|
| 2006/0163497 A1* | 7/2006 | Kodama et al. | 250/492.21 |
| 2007/0145300 A1* | 6/2007 | Tomimatsu et al. | 250/492.21 |
| 2007/0272854 A1* | 11/2007 | Agorio et al. | 250/304 |

FOREIGN PATENT DOCUMENTS

JP 2002-365182 12/2002

* cited by examiner

*Primary Examiner*—Jack I Berman
*Assistant Examiner*—Nicole Ippolito Rausch
(74) *Attorney, Agent, or Firm*—Brinks Hofer Gilson & Lione

(57) ABSTRACT

A wafer holder includes: a frame-shaped holder main body which has an opening at its center and carries a wafer on its upper surface; guide members which contact the outer periphery of the wafer placed on the holder main body and position the wafer on the holder main body; and cross section sample holding members which are disposed on an outer circumference of the holder main body and holds a cross section sample produced from the wafer. Each of the cross section sample holding members includes plate-shaped sample stands to which the cross section sample is fixed, and fixing stands each of which is detachably attached to the holder main body and pinches the sample stand such that the sample stand is attachable to and detachable from the fixing stand.

6 Claims, 13 Drawing Sheets

WAFER HOLDER AND SAMPLE PRODUCING APPARATUS USING IT

This application claims priority under 35 U.S.C. § 119 to Japanese Patent Application Nos. JP2006-052601 filed Feb. 28, 2006, and JP2006-32609 filed Feb. 13, 2007, the entire content of which is hereby incorporated by reference.

BACKGROUND OF THE INVENTION

The present invention relates to a wafer holder for positioning and holding a wafer, and a sample producing apparatus for producing a cross section sample from a wafer supported by the wafer holder.

Currently, a transmission electron microscope (TEM) is used for evaluating a defect on a wafer of a semiconductor or the like caused during manufacture. For the evaluation of the defect, the transmission electron microscope observes an extremely thin cross section sample cut from the wafer. This extremely thin cross section sample is produced by using a focusing ion beam apparatus. According to the sample production method using the focusing ion beam apparatus, a predetermined position of the wafer is etched by applying focusing ion beam thereto, and a thin piece having a thickness appropriate for the observation by the transmission electron microscope is produced as the cross section sample. Thereafter, the cross section sample is extracted from the wafer and transferred to the transmission electron microscope for the observation. The conventional type of focusing ion beam apparatus for producing the cross section sample has a wafer transfer mechanism for transferring a wafer from which a cross section sample is produced to a sample chamber and a cross section sample transfer mechanism for transferring the produced cross section sample from the sample chamber to the outside. In this structure, therefore, only the cross section sample is transferred from the sample chamber to the outside transmission electron microscope. According to this focusing ion beam apparatus, however, the entire size of the apparatus is large since two different transfer routes are included. In addition, since a sufficient space for the movements of both the wafer transfer mechanism and the cross section sample transfer mechanism is needed within the sample chamber, the size of the sample chamber itself increases. As a result, evacuation for the interior of the sample chamber deteriorates.

For overcoming these drawbacks, a sample producing apparatus including a wafer cassette on which a wafer is placed, a sample chamber containing an ion beam optical system and other components, a wafer transfer chamber, a cartridge transfer chamber, a cartridge transfer mechanism accommodated in the cartridge transfer chamber has been proposed (see, for example, JP-A-2002-365182). According to this sample producing apparatus, the cartridge transfer chamber has a cartridge station in which a cartridge for holding a cross section sample is stored. The cartridge is transferred between the cartridge station in the cartridge transfer chamber and the wafer cassette disposed in the wafer transfer chamber by the cartridge transfer mechanism. The wafer cassette is transferred between a sample stage in the sample chamber and the wafer transfer chamber. In this structure, a cross section sample produced from a wafer in the sample chamber is held by the cartridge and transferred to the wafer transfer chamber with the wafer. Then, the cross section sample is transferred from the wafer cassette to the cartridge station by the cartridge transfer mechanism. Therefore, the cross section sample can be transferred with the wafer cassette, and thus the volume of the sample chamber can be reduced.

According to the sample producing apparatus disclosed in JP-A-2002-365182, the cartridge holding the cross section sample is attached to a wafer holder together with the wafer for transfer. However, no specific means for attaching and detaching the cartridge to and from the wafer holder is shown in the reference. Even if fixing the cartridge to the wafer holder is possible, the wafer holder to which the cartridge is fixed is large-sized and heavyweight since the cartridge having a complicated mechanism has a certain weight. As a result, the size of the mechanism for transferring the wafer holder increases, and thus the entire size of the apparatus which accommodates the wafer holder and the mechanism for transferring the wafer holder increases.

The invention has been developed to solve the problems discussed above. It is an object of the invention to provide a compact and lightweight wafer holder capable of simultaneously transferring a wafer and a cross section sample produced from the wafer, and a sample producing apparatus having a small-sized entire structure and capable of simultaneously transferring the wafer and the cross section sample by using the wafer holder.

SUMMARY OF THE INVENTION

In order to solve the above problems, the followings are proposed according to the invention.

A wafer holder according to the invention includes: a frame-shaped holder main body which has an opening at its center and carries a wafer on its upper surface; a guide member which contacts the outer periphery of the wafer placed on the holder main body and positions the wafer on the holder main body; and a cross section sample holding member which is disposed on the outer circumference of the holder main body and holds a cross section sample produced from the wafer. The cross section sample holding member includes a plate-shaped sample stand to which the cross section sample is fixed, and a fixing stand which is detachably attached to the holder main body and pinches the sample stand such that the sample stand is attachable to and detachable from the fixing stand.

According to the wafer holder in this aspect of the invention, a wafer can be easily positioned and held on the wafer holder main body by the guide member when the wafer is placed on the wafer holder main body. After a cross section sample is produced from the wafer placed on the wafer holder main body, the wafer and the cross section sample can be simultaneously transferred by fixing the cross section sample to the sample stand of the cross section sample holding member. Since the cross section sample holding member has a simple structure having the fixing stand for pinching the plate-shaped sample stand to which the cross section sample is fixed, the size and weight of the cross section sample holding member is reduced by the presence of the fixing stand. In addition, since the holder main body is a frame-shaped component having the opening at its center, the wafer and the cross section sample can be simultaneously transferred and the weight of the entire apparatus can be reduced. After all the processes are completed, the wafer and the cross section sample are separated from each other and a new wafer and a cross section sample produced therefrom are transferred. In this step, the wafer can be easily separated only by lifting the wafer at the central opening of the holder main body. Also, the cross section sample can be easily separated by removing the fixing stand pinching the sample stand to which the cross section sample is kept fixed. In addition, the cross section sample which is extremely thin and small can be easily handled. When the observation and other processes for the cross section sample are completed, the sample stand pinched by the fixing stand is replaced with a new one so as to attach the new sample stand to the holder main body again and transfer the new cross section sample.

In the wafer holder described above, it is more preferable that the cross section sample holding member has a sample cassette engaging with the outer circumference of the holder main body such that the sample cassette is attachable to and detachable from the holder main body, and that a plurality of the fixing stands engage with the sample cassette such that the fixing stands are attachable to and detachable from the sample cassette.

According to the wafer holder in this aspect of the invention, a plurality of cross section samples can be simultaneously transferred since a plurality of the fixing stands engage with the sample cassette. Moreover, since the sample cassette engages with the holder main body such that the sample cassette is attachable to and detachable from the holder main body, plural cross section samples can be handled by the unit of the sample cassette while being attached to the sample cassette via the fixing stands. Thus, cross section samples can be easily treated.

A sample producing apparatus according to the invention includes: the wafer holder described above; a sample chamber for accommodating the wafer holder holding the wafer and evacuating inside air into vacuum; a charged particle beam tube for producing the cross section sample by applying charged particle beam to the wafer accommodated in the interior of the sample chamber and etching the wafer; extraction and transfer means for extracting the produced cross section sample from the wafer and transferring the extracted cross section sample to the sample stand of the wafer holder; bonding means for bonding the cross section sample to the sample stand; and a load lock chamber which is connected with the sample chamber via an openable and closable sample chamber valve and connected with the outside via an openable and closable outside valve, and evacuates air inside the load lock chamber into vacuum. The load lock chamber contains a holder stand on which the wafer holder is disposed with a space below the wafer holder, an elevator disposed below the wafer holder placed on the holder stand for lifting the wafer held by the wafer holder by moving upward and downward, and an inside transfer robot for transferring the wafer holder between the holder stand and the interior of the sample chamber.

According to the sample producing apparatus in this aspect of the invention, the sample chamber which accommodates the wafer holder holding the wafer can be made compact by using the miniaturized and lightweight wafer holder. In addition, since the small and lightweight wafer holder is used, the size of the inside transfer robot for transferring the wafer holder and the size of the corresponding load lock chamber can be reduced. The cross section sample is produced by etching the wafer to which charged particle beam is applied is extracted by the extraction and transfer means. Then, the extracted cross section sample is transferred to the sample stand on the cross section sample holding member of the wafer holder and fixed to the sample stand by the bonding means. Since the transfer route is unified by transferring the wafer and the cross section sample simultaneously by using the wafer holder holding both the cross section sample and the wafer, the space necessary for the transfer route can be reduced. Since the sample chamber and the load lock chamber are made compact, evacuation of air in the sample chamber and the load lock chamber into vacuum can be improved and the entire size of the apparatus can be reduced. In addition, the throughput in the processes from transferring the wafer to producing the cross section sample and transferring the wafer and the cross section sample to the outside can be improved, because the wafer is easily separated from the wafer holder by raising the wafer through the opening of the holder main body of the wafer holder using the elevator together with the advantage that the wafer and the cross section sample are simultaneously transferred.

In the sample producing apparatus described above, it is more preferable that the outside valve in the load lock chamber includes a wafer valve for transferring the wafer between the load lock chamber and the outside, and a holder valve for transferring the wafer holder between the load lock chamber and the outside.

According to the sample producing apparatus in this aspect of the invention, the entire size of the apparatus is reduced by unifying the transfer of the wafer and the wafer holder from the sample chamber to the load lock chamber. In addition, two routes passing through the wafer valve and through the holder valve are provided for the transfer of the wafer and the wafer holder to the outside. Thus, the wafer and the cross section sample can be efficiently transferred to the outside without complication. Moreover, the mechanism for transferring the wafer to the outside is separated from the mechanism for transferring the wafer holder holding the cross section sample to the outside. Thus, the mechanism for transferring the wafer can be provided as a mechanism offering minute operations, while the mechanism for transferring the wafer holder can be provided as a mechanism capable of transferring a relatively heavy load compared with the mechanism for transferring the wafer so as to efficiently transfer the wafer holder.

In the sample producing apparatus described above, it is more preferable that the load lock chamber includes a holder chamber containing the holder stand and the elevator and a robot chamber containing the inside transfer robot. It is also preferable that the holder chamber and the robot chamber are connected with each other via an openable and closable gate valve, and that air inside the holder chamber and the robot chamber is independently evacuated into vacuum.

According to the sample producing apparatus in this aspect of the invention, the load lock chamber is divided into two chambers constituted by the robot chamber and the holder chamber, and air in each of the chambers can be independently evacuated into vacuum with the gate valve closed. Thus, evacuation for these chambers is improved with higher efficiency.

In the sample producing apparatus described above, it is more preferable that a sample stage for supporting the wafer holder is provided in the interior of the sample chamber. The sample stage preferably includes a first electrostatic chuck having a frame shape corresponding to the shape of the holder main body of the wafer holder to attract and hold the holder main body, and a second electrostatic chuck projecting upward from the inside of the first electrostatic chuck to attract and hold the wafer placed on the holder main body attracted and held by the first electrostatic chuck.

According to the sample producing apparatus in this aspect of the invention, the wafer holder and the wafer are attracted and held by the first and second electrostatic chucks by electrostatic force on the sample stage provided in the interior of the sample chamber. In this case, the wafer holder and the wafer can be attached and detached without requiring operation by an operator with the sample chamber kept vacuumed. Thus, generation of contaminants such as dust is prevented. Also, the wafer is attracted and held uniformly in a wide range without distortion. Furthermore, the weight of the sample stage is reduced, and the natural frequency of the sample stage is set at a higher frequency. Accordingly, lowering of resolution of the focusing ion beam caused by contaminants, deformation of the wafer, and vibration of the sample stage is avoided. Since the wafer holder and the wafer are attached and detached without requiring operation by the operator, time necessary for the attachment and detachment is reduced and possibility of breakage of the wafer or the like by the operator is eliminated. According to the structure, the wafer holder and the wafer are separately attracted and held by the first electrostatic chuck and the second electrostatic chuck, respectively, allowing reduction of only the voltage applied to the second electrostatic chuck necessary for holding the light-weight wafer. As a result, leakage current flowing in the wafer is decreased, and thus the possibility that the emitted focusing ion beam is affected by the leakage current is eliminated. Moreover, since the time required for detaching the wafer from the second electrostatic chuck is reduced, the throughput is improved. According to the structure, the second electrostatic chuck projects upward to attract and hold the wafer under the condition in which the holder main body of the wafer holder is attracted and held by the first electrostatic chuck. Thus, the observation surface of the wafer attracted and held by the second electrostatic chuck is controlled in such a position as to correspond to the focusing height of the focusing ion beam with the wafer remaining on the wafer holder. As a result, the resolution of the focusing ion beam is further enhanced.

ADVANTAGE OF THE INVENTION

According to the wafer holder of the invention, a wafer and a cross section sample can be simultaneously transferred and the size and weight of the wafer holder can be reduced by providing the sample holding member on the outer circumference of the frame-shaped holder main body.

According to the sample producing apparatus of the invention, a wafer and a cross section sample produced therefrom can be efficiently transferred and the entire size of the apparatus can be reduced by using the small-sized and lightweight wafer holder which transfers the produced cross section sample with the wafer.

DETAILED DESCRIPTION OF THE PREFERRED EMBODIMENT

Figure 1:
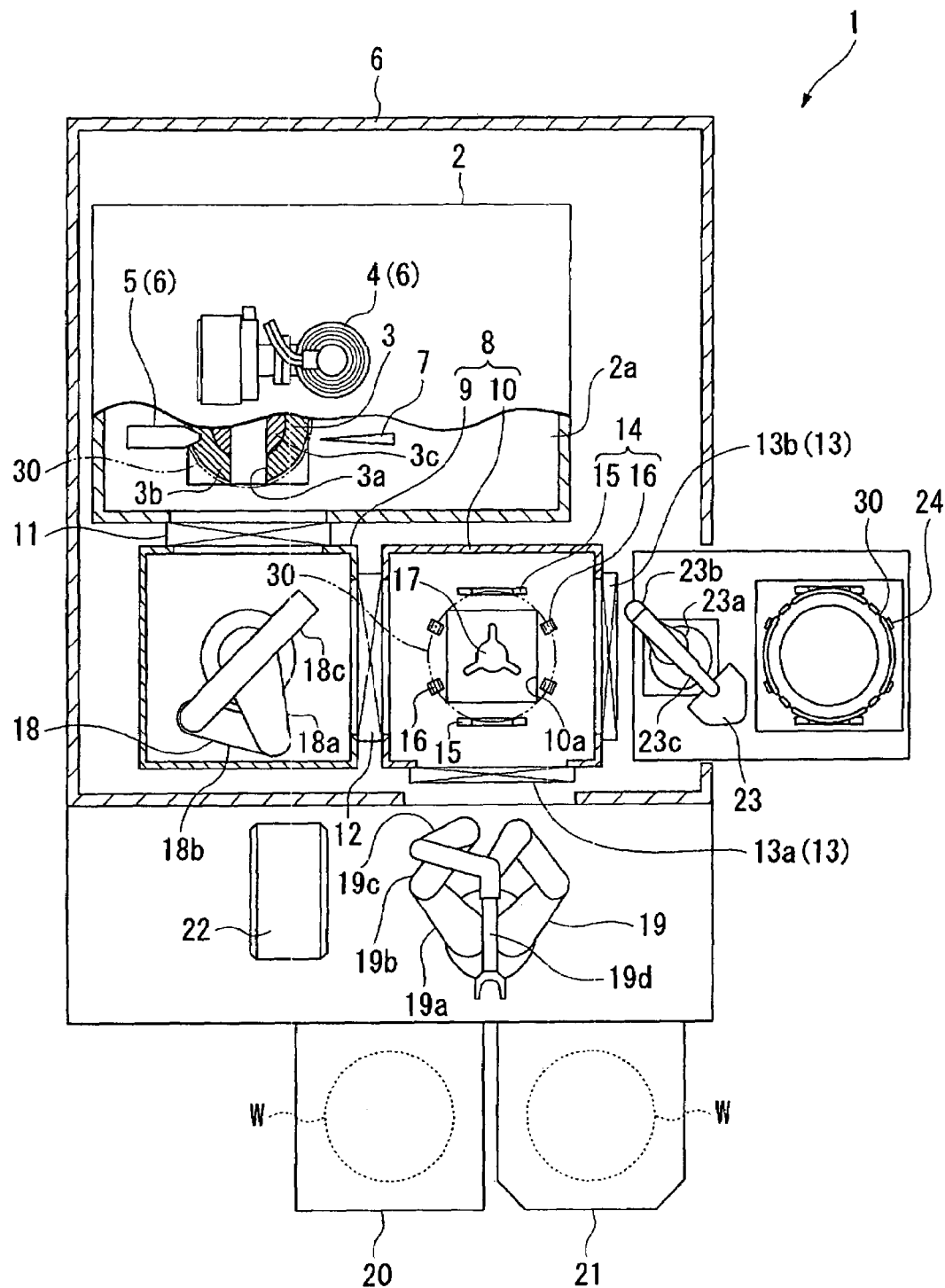
FIG. 1 illustrates an entire structure of a focusing ion beam apparatus in an embodiment according to the invention.

FIGS. 1 through 15 show an embodiment according to the invention. As illustrated in FIG. 1, a sample producing apparatus 1 transfers a substantially plate-shaped wafer W to a sample chamber 2 by using a wafer holder 30 shown in FIG. 2, and applies focusing ion beam (charged particle beam) to the wafer W in an interior 2a of the sample chamber 2 to produce a cross section sample. The sample producing apparatus 1 and the wafer holder 30 are hereinafter described in detail.

Figure 2:
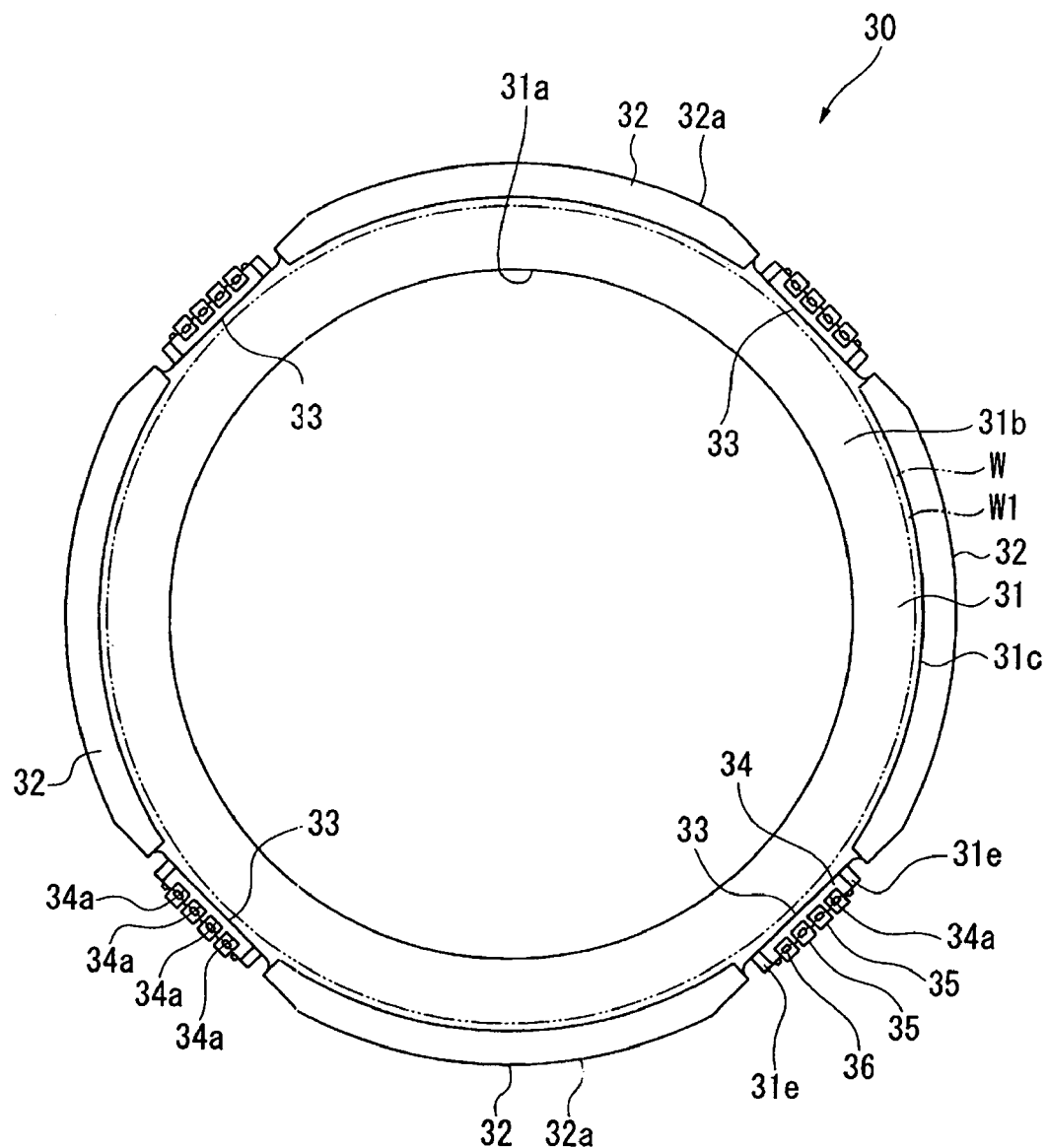
FIG. 2 is a plan view of a wafer holder in the embodiment according to the invention.
Figure 3:
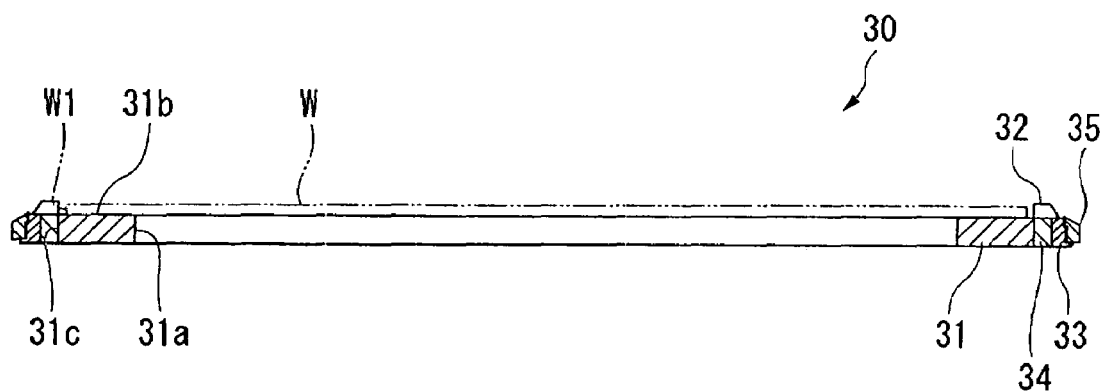
FIG. 3 is a cross-sectional view of the wafer holder in the embodiment according to the invention.

As illustrated in FIGS. 2 and 3, the wafer holder 30 is frame-shaped and has an opening 31a at its center. The wafer holder 30 includes a holder main body 31 having an upper surface 31b on which the wafer W can be placed, and guide members 32 contacting an outer periphery W1 of the wafer W to position the wafer W on the holder main body 31 and positioning the wafer W on the holder main body 31. The guide members 32 are provided at four positions of an outer circumference 31c of the holder main body 31 at equal intervals with clearances between one another, and a cross section sample holding member 33 for holding the cross section sample produced from the wafer W is provided on each clearance between the guide members 32. Each of the cross section sample holding member 33 has a sample cassette 34 attached to the holder main body 31, fixing stands 35 attached to the sample cassette 34, and substantially plate-shaped sample stands 36 pinched by the fixing stands 35. Each of the sample cassette 34 engages with a pair of engaging convexes 31e provided on the outer circumference 31c of the holder main body 31 such that the sample cassette 34 is attachable to and detachable from the engaging convexes 31e. The sample cassette 34 has four concaves 34a, each of which engages with one of the fixing stands 35 such that the fixing stands 35 can be attachable to and detachable from the concaves 34a.

Figure 4:
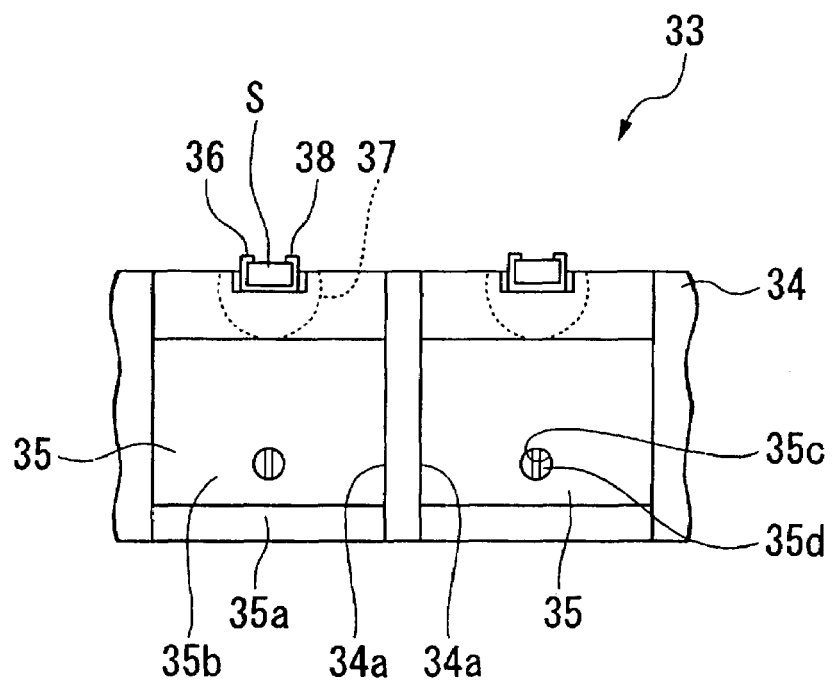
FIG. 4 is an enlarged side view showing a sample holding member of the wafer holder in the embodiment according to the invention.
Figure 5:
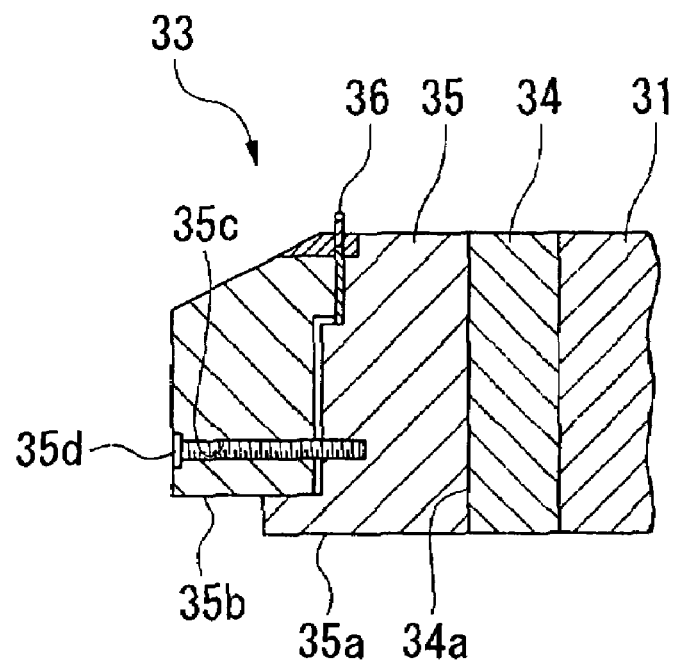
FIG. 5 is an enlarged cross-sectional view of the sample holding member of the wafer holder in the embodiment according to the invention.
Figure 6:
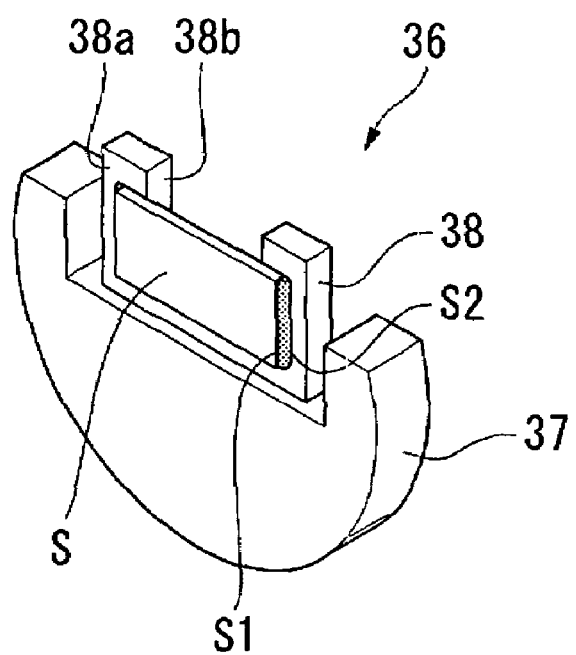
FIG. 6 is a perspective view of a sample stand in the embodiment according to the invention.

As illustrated in FIGS. 4 and 5, each of the fixing stands 35 has a base 35a and a fixing portion 35b. A screw hole 35c is formed on each of the base 35a and the fixing portion 35b. The sample stand 36 is inserted between the base 35a and the fixing portion 35b and a fixing screw 35d is screwed into the screw hole 35c such that the fixing stand 35 can pinch the sample stand 36. As illustrated in FIG. 6, the sample stand 36 has a substantially plate-shaped metal mesh 37 and a supporting member 38 formed on the upper surface of the metal mesh 37. In FIG. 6, a cross section sample S in a fixed condition is shown. As will be described later, the cross section sample S is bonded to a side surface 38a of the supporting member 38 and an observing window 38b is formed by cutting the portion to which the cross section sample S is bonded.

Figure 7:
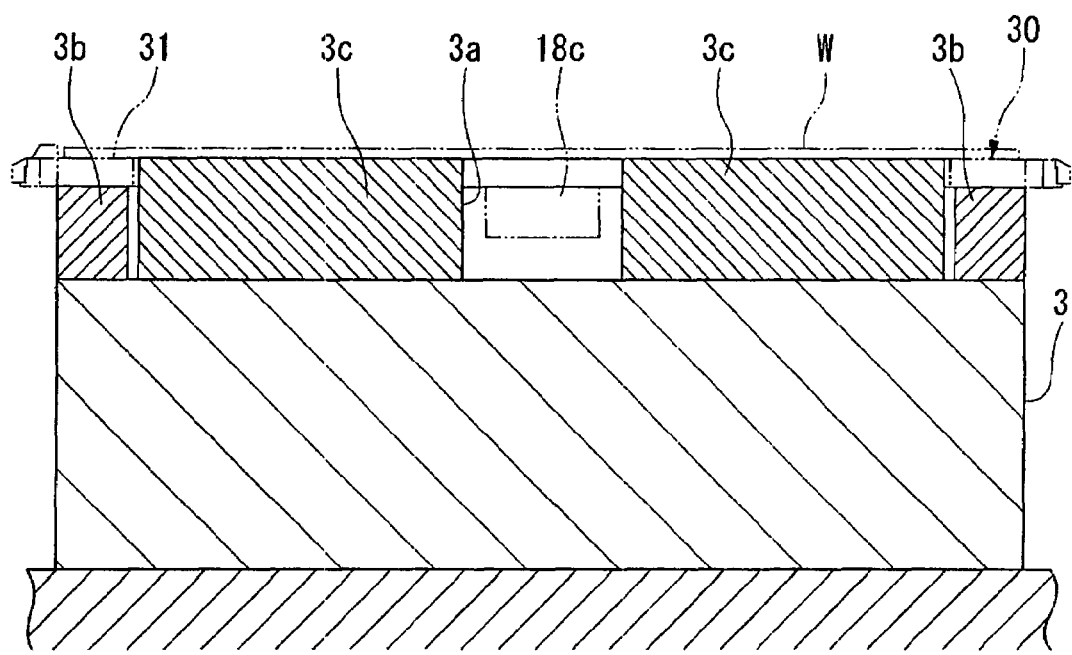
FIG. 7 is a cross-sectional view of a sample stage in the embodiment according to the invention.

As illustrated in FIG. 1, the sample chamber 2 where the cross section sample S is produced from the wafer W has a sample stage 3 on which the wafer holder 30 holding the wafer W can be placed. The sample stage 3 can control the position of the wafer W in three axial directions, and supports the wafer W such that the wafer W can rotate. The sample stage 3 may be any type as long as it can control the position at least in three axial directions. As illustrated in FIG. 7, the sample stage 3 has a frame shape corresponding to the shape of the holder main body 31 of the wafer holder 30. The sample stage 3 has a first electrostatic chuck 3b which can attract and hold the holder main body 31, and a second electrostatic chuck 3c provided inside the first electrostatic chuck 3b. The second electrostatic chuck 3c projects upward to attract and hold the wafer W placed on the holder main body 31 of the wafer holder 30 under the condition where the holder main body 31 is attracted and held by the first electrostatic chuck 3b. More specifically, the length of the upward projecting portion of the second electrostatic chuck 3c from the first electrostatic chuck 3b is substantially equal to the thickness of the holder main body 31. A not-shown controller determines voltages individually for the first electrostatic chuck 3b and the second electrostatic chuck 3c, and applies the corresponding voltages to the first and second electrostatic chucks 3b and 3c. As a result, the first and second electrostatic chucks 3b and 3c generate electrostatic forces in accordance with the applied voltages and thereby attract and hold the holder main body 31 of the wafer holder 30 and the wafer W, respectively. An insertion groove 3a through which a distal end arm 18c of an inside transfer robot 18 to be described later is inserted is formed in the central area of the second electrostatic chuck 3c.

A focusing ion beam tube 4 which applies focusing ion beam to the wafer W positioned on the sample stage 3 and held by the wafer holder 30 is equipped above the sample stage 3. More specifically, the focusing ion beam tube 4 has an ion source such as gallium ion inside its body. The focusing ion beam tube 4 draws ion from the ion source and accelerates the ion by applying voltage thereto, and focuses the ion by an electrostatic lens so as to apply focusing ion beam. The focusing ion beam tube 4 has a not-shown deflecting electrode for controlling the irradiation position of focusing ion beam within a predetermined range. Thus, the focusing ion beam tube 4 can apply focusing ion beam to a predetermined position of the wafer W in cooperation with the sample stage 3.

A gas gun 5 for spouting deposition gas to the irradiation position of the focusing ion beam is equipped in the interior 2a of the sample chamber 2. The deposition gas released from the gas gun 5 is W(CO)6, for example, and is given to the irradiation position with the irradiation of focusing ion beam so as to form a deposition film made of tungsten at the irradiation position. The deposition gas is not limited to the one in this example, but may be other appropriate gases selected according to the materials constituting the deposition film. The focusing ion beam tube 4 and the gas gun 5 constitute bonding means 6 which bonds the cross section sample S to the supporting member 38 of the sample stand 36 as will be described later. A probe 7 as extracting and transferring means which extracts the cross section sample S produced from the wafer W by the focusing ion beam and transfers the cross section sample S to the sample holding member 33 is equipped in the interior 2a of the sample chamber 2. The probe 7 is an extremely narrow and bar-shaped component made of glass and produced by heating a glass bar and cutting its tip having been drawn out, for example. When the probe 7 contacts the cross section sample S, electrostatic force is generated between the probe 7 and the cross section sample S. Thus, the probe 7 can attract and transfer the cross section sample S.

As illustrated in FIG. 1, a load lock chamber 8 is provided adjacent to the sample chamber 2. The load lock chamber 8 has two chambers constituted by a robot chamber 9 and a holder chamber 10. The robot chamber 9 is connected with the sample chamber 2 by an openable and closable sample chamber valve 11. The robot chamber 9 is connected with the holder chamber 10 by an openable and closable gate valve 12. The holder chamber 10 has an openable and closable outside valve 13 connecting with the outside constituted by a wafer valve 13a for transferring the wafer W and a holder valve 13b for transferring the wafer holder 30 each of which faces in different directions. More specifically, in the holder chamber 10, the gate valve 12 and the holder valve 13b are opposed to each other, and the wafer valve 13a is disposed perpendicular to the gate valve 12 and the holder valve 13b. Each of the sample chamber 2, the robot chamber 9, and the holder chamber 10 has a not-shown evacuation means. Air in these chambers can be independently evacuated into vacuum by closing the sample chamber valve 11, the gate valve 12, the wafer valve 13a, and the holder valve 13b.

Figure 8:
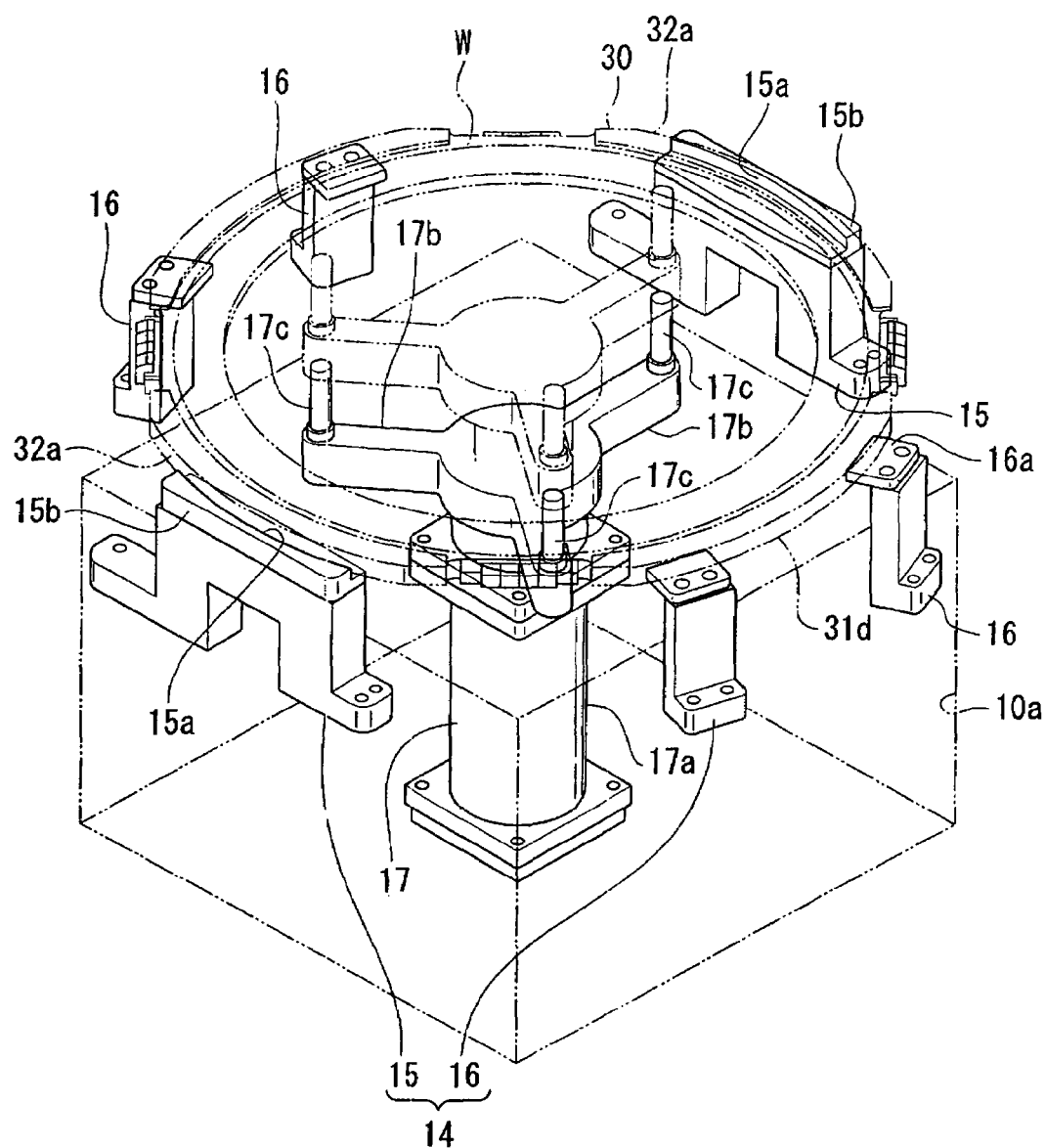
FIG. 8 is a perspective view of a holder stand and an elevator in the embodiment according to the invention.

The holder chamber 10 has a holder stand 14 on which the wafer holder 30 is placed with a space below the wafer holder 30. As illustrated in FIGS. 1 and 8, the holder stand 14 is constituted by two main stands 15 disposed in parallel in the direction where the wafer W is transferred from the wafer valve 13a to the outside, and four sub stands 16 disposed with clearances between one another along the transfer route for transferring the wafer holder 30 from the robot chamber 9 via the gate valve 12 to the holder chamber 10 and from the holder valve 13b to the outside. A receiving member 15b having a step 15a which corresponds to the shape of the wafer holder 30 is provided on each upper part of the main stands 15. The receiving member 15b supports and positions the wafer holder 30 by the contact between the step 15a and a lower surface 31d of the holder main body 31 and a side surface 32a of the guide member 32 of the wafer holder 30. A receiving member 16a is provided on each upper part of the sub stands 16. The receiving member 16a contacts the lower surface 31d of the holder main body 31 of the wafer holder 30 to support the wafer holder 30.

An accommodating concave 10a is formed on the floor of the holder chamber 10. An elevator 17 is equipped within the accommodating concave 10a. The elevator 17 fixed to the bottom surface of the accommodating concave 10a has a cylinder 17a which expands and contracts upward and downward by a not-shown driving unit, arms 17b extending from the upper end of the cylinder 17a in the horizontal three directions, and supporting pins 17c projecting upward from the respective ends of the arms 17b. As illustrated in FIG. 8, the elevator 17 is disposed within a space below the wafer holder 30 with the cylinder 17a contracted when the wafer holder 30 holding wafer W is placed on the holder stand 14. The wafer W can be raised with the supporting pins 17c contacting the lower surface of the wafer W by expanding the cylinder 17a. While the elevator 17 is disposed within the accommodating concave 10a in this embodiment, the elevator 17 may be located directly on the floor of the holder chamber 10 without forming the accommodating concave 10a in the case where the elevator 17 can be provided in the space between the floor of the holder chamber 10 and the wafer holder 30 by increasing the height of the holder stand 14.

As illustrated in FIG. 1, the robot chamber 9 has an inside transfer robot 18 for transferring the wafer holder 30 between the holder stand 14 in the holder chamber 10 and the sample stage 3 in the interior 2a of the sample chamber 2. In this embodiment, the inside transfer robot 18 has three arms constituted by a base end arm 18a, an intermediate arm 18b, and a distal end arm 18c, each of which is freely rotatable by a not-shown driving unit.

As illustrated in FIG. 1, a wafer transfer robot 19 for transferring the wafer W, wafer cassettes 20, 21 for accommodating a plurality of wafers W supplied before and after the wafer W from which the cross section sample S is produced, and a wafer aligner 22 for detecting the direction of the wafer W are provided outside the wafer valve 13a of the holder chamber 10. In this embodiment, the wafer transfer robot 19 has four arms constituted by a base end arm 19a, intermediate arms 19b and 19c, and a distal end arm 19d, each of which is freely rotatable by a not-shown driving unit. The wafer W can be placed on the distal end arm 19d, and passed between each of the wafer cassettes 20 and 21 and the interior of the holder chamber 10 by cooperation of the base end arm 19a, the intermediate arms 19b and 19c, and the distal end arm 19d.

A holder transfer robot 23 for transferring the wafer holder 30 and a holder carrier 24 on which the transferred wafer holder 30 is placed are provided outside the holder valve 13b of the holder chamber 10. In this embodiment, the holder transfer robot 23 has three arms constituted by a base arm 23a, an intermediate arm 23b, and a distal end arm 23c. The base end arm 23a and the intermediate arm 23b are freely rotatable by a not-shown driving unit. The distal end arm 23c freely slides on the intermediate arm 23b. The wafer holder 30 can be passed between the interior of the holder chamber 10 and the holder carrier 24 by cooperation of the base end arm 23a, the intermediate arm 23b, and the distal end arm 23c.

Figure 9:
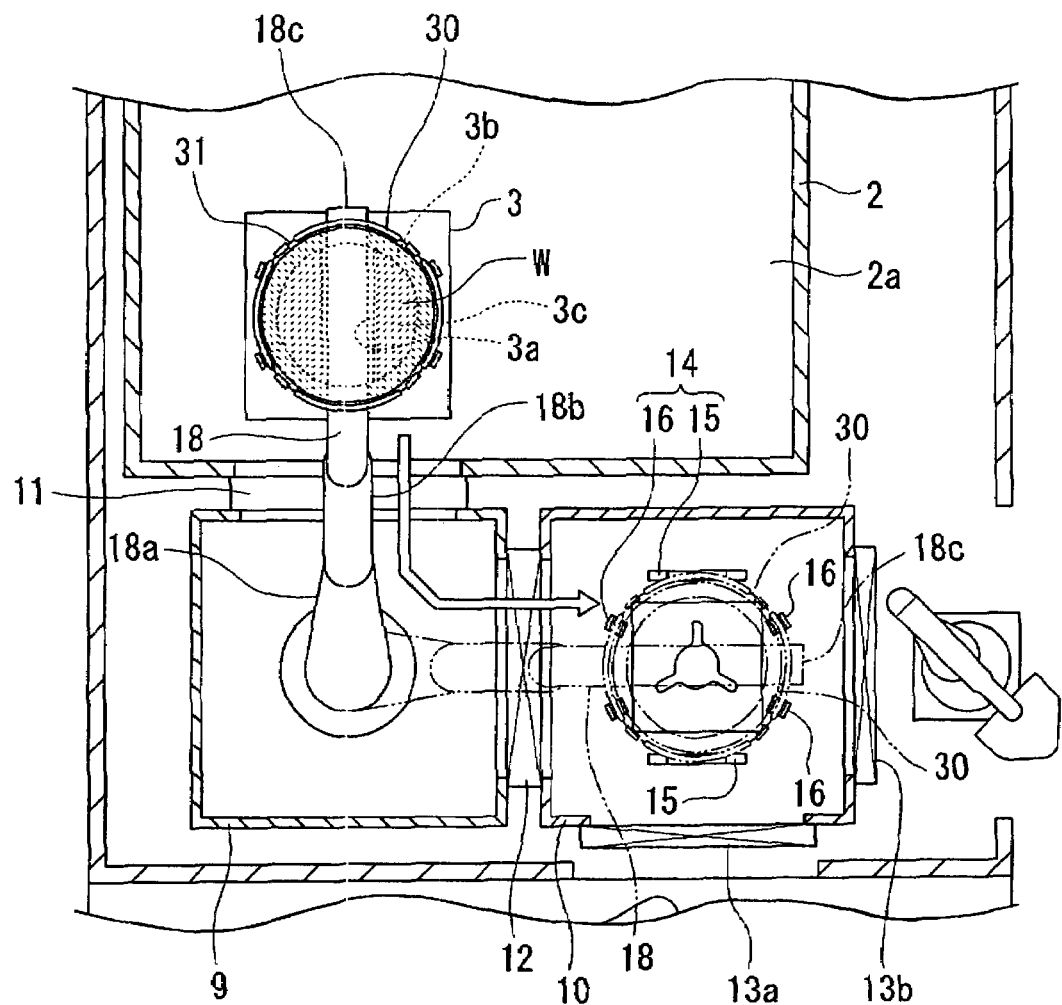
FIG. 9 illustrates the focusing ion beam apparatus in the embodiment according to the invention.
Figures 10A, 10B:
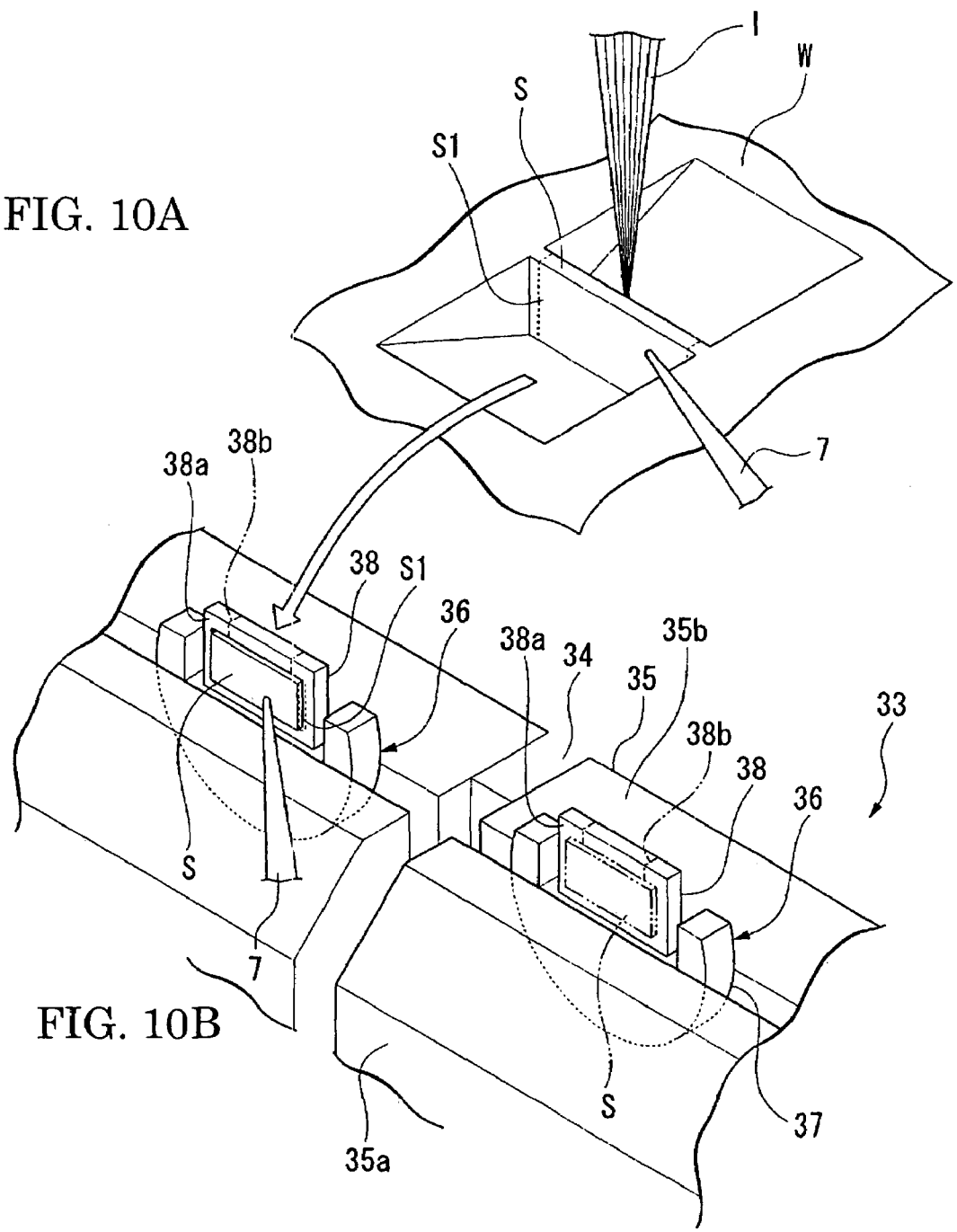
FIGS. 10A and 10B show a process for producing a cross section sample in the embodiment according to the invention.

The operations of the sample producing apparatus 1 and the wafer holder 30 are now discussed. FIG. 9 shows a condition where the wafer holder 30 holding the wafer W is placed on the sample stage 3 in the sample chamber 2. On the sample stage 3, the holder main body 31 of the wafer holder 30 is attracted and held by the first electrostatic chuck 3b, and the wafer W is attracted and held by the second electrostatic chuck 3c provided independently from the first electrostatic chuck 3b. The cross section sample S is produced with the sample chamber valve 11 closed and the interior 2a of the sample chamber 2 kept under vacuum by the not-shown evacuation means. As illustrated in FIG. 10A, focusing ion beam I is initially applied to a predetermined position of the wafer W held by the wafer holder 30 by using the focusing ion beam tube 4. The predetermined position of the wafer W is subsequently etched to obtain a thin piece having an extremely thin shape of the cross section sample S. During this process, the wafer holder 30 and the wafer W are attracted and held by the first and second electrostatic chucks 3b and 3c, respectively, by electrostatic force. In this case, the wafer holder 30 and the wafer W can be attached and detached without requiring operation by an operator with the interior 2a of the sample chamber 2 kept vacuumed. Thus, generation of contaminants such as dust from the operator, or contaminants such as dust from mechanical connections or other components is prevented. Also, since electrostatic force is used, the wafer W is attracted and held uniformly in a wide range without distortion. Furthermore, the weight of the sample stage 3 is reduced, and the natural frequency of the sample stage 3 is set at a higher frequency. Accordingly, lowering of resolution of the focusing ion beam I caused by contaminants, deformation of the wafer W, vibration of the sample stage 3 is avoided, and therefore accuracy of processing and observation for the wafer W is increased. The wafer holder 30 and the wafer W are separately attracted and held by the first electrostatic chuck 3b and the second electrostatic chuck 3c, respectively, allowing reduction of only the voltage applied to the second electrostatic chuck 3c necessary for holding the lightweight wafer W. As a result, leakage current flowing in the wafer W is decreased, and thus the possibility that the emitted focusing ion beam I is affected by the leakage current is eliminated. According to this structure, the second electrostatic chuck 3c projects upward to attract and hold the wafer W under the condition in which the holder main body 31 of the wafer holder 30 is attracted and held by the first electrostatic chuck 3b. Thus, the observation surface of the wafer W attracted and held by the second electrostatic chuck 3c is controlled in such a position as to correspond to the focusing height of the focusing ion beam I with the wafer W remaining on the wafer holder 30. As a result, the resolution of the focusing ion beam I is further enhanced.

Then, sides S1 of the cross section sample S are cut off and the cross section sample S is extracted by the probe 7 as the extracting and transferring means. Thereafter, as illustrated in FIG. 10B, one of the sample stands 36 pinched by the fixing stands 35 of the sample supporting members 33 is selected and the extracted cross section sample S is brought into contact with the side surface 38a of the supporting member 38. Since the fixing stand 35 of the sample supporting member 33 provided on the holder main body 31 is positioned substantially at the same height as that of the observation surface of the wafer W, the distance for which the extracted cross section sample S is shifted to reach the sample stand 36 pinched by the fixing stand 35 is reduced to the minimum distance. Therefore, possible drop and breakage of the cross section sample S during the shift can be avoided. Then, the cross section sample S and the supporting member 38 are bonded and fixed to each other by the bonding means 6 shown in FIG. 1. More specifically, focusing ion beam is applied to the sides S1 of the cross section sample S by the focusing ion beam tube 4, and deposition gas is spouted to the sides S1 by the gas gun 5. Deposition films S2 are thus formed on the sides S1 of the cross section sample S, and the cross section sample S is bonded and fixed to the supporting member 38 by the deposition films S2. The supporting member 38 is further etched by applying focusing ion beam to the portion corresponding to the observing window 38b of the supporting member 38 so as to form the observing window 38b. By this method, the cross section sample S fixed to the sample stand 38 is produced as a sample which can be observed by a transmission electron microscope through the observing window 38b. Since the cross section sample S is produced from the predetermined position of the wafer W and then is fixed to the sample holding member 33, the wafer W and the produced cross section sample S can be simultaneously transferred. In this embodiment, the four sample cassettes 34 are provided on the wafer holder 30, and each of the sample cassettes 34 has the four fixing stands 35. Thus, up to 16 pieces of the cross section samples S can be extracted from one wafer W, and then fixed to the sample holding members 33 and simultaneously transferred. Since both the wafer W and the cross section sample holding members 33 holding the produced cross section samples S are positioned on the wafer holder 30, the processes for production and extraction of the cross section samples S can be efficiently performed. Also, the space of the interior 2a of the sample chamber 2 can be reduced to the minimum.

After the production and extraction of the cross section sample S is completed, the wafer W and the cross section sample S are transferred to the outside. Initially, attraction of the wafer holder 30 and the wafer W by the first electrostatic chuck 3b and the second electrostatic chuck 3c are released by the not-shown controller. Since this attraction is produced by the electrostatic force, the attraction is released without requiring operation by the operator. Thus, time necessary for the attachment and detachment is reduced, and possibility of breakage of the wafer W or the like by the operator is eliminated. Moreover, since the voltage applied to the second electrostatic chuck 3c necessary for attracting the wafer W is reduced, the time required for the release of the attraction and the detachment of the wafer W can be decreased, resulting in improvement of the throughput. Then, as illustrated in FIG. 9, the inside air pressure of the robot chamber 9 is initially made equivalent to the air pressure of the interior 2a of the sample chamber 2 by the not-shown evacuation means with the sample chamber valve 11 and the gate valve 12 closed. Then, the sample chamber valve 11 is opened under this condition. By this method, the vacuum condition of the interior 2a of the sample chamber 2 is maintained, and flow of unnecessary dust and the like into the interior 2a of the sample chamber 2 is prevented. Thereafter, the inside transfer robot 18 is actuated to insert the distal end arm 18c into the insertion groove 3a of the sample stage 3. Subsequently, the distal end arm 18c is brought into contact with the lower surface of the wafer holder 30 to transfer the wafer holder 30 to the inside of the robot chamber 9. The wafer holder 30 is a frame-shaped component whose holder main body 31 has the opening 31a at its center, and the sample holding members 33 holding the cross section sample S have an extremely simple structure constituted by the sample cassettes 34, the fixing stands 35, and the sample stands 36. Thus, the size and weight of the wafer holder 30 can be reduced to the minimum, and therefore the inside transfer robot 18 for transferring the wafer holder 30 can be made compact. In addition, the space required for the transfer route can be reduced.

Figure 11:
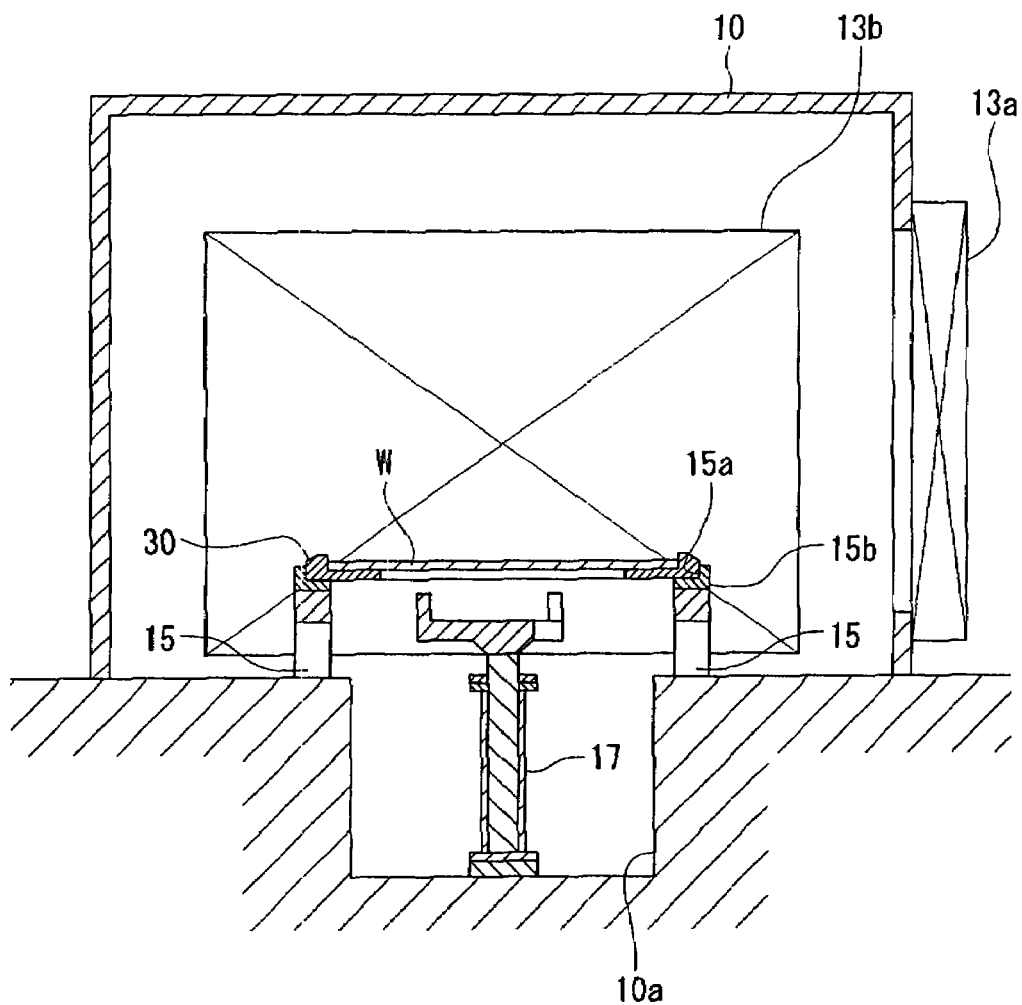
FIG. 11 is a cross-sectional view of a holder chamber in the focusing ion beam apparatus in the embodiment according to the invention.

Subsequently, the gate valve 12 is opened after the sample chamber valve 11 is closed. In this process, the air inside the holder chamber 10 is evacuated by the not-shown evacuation means with the wafer valve 13a and the holder valve 13b as the outside valve 13 closed such that the air pressure in the holder chamber 10 becomes equivalent to the air pressure in the robot chamber 9. Thus, the vacuum condition of the inside of the robot chamber 9 can be maintained even when the gate valve 12 is opened. Then, the wafer holder 30 placed on the distal end arm 18c is transferred to the holder chamber 10. Since the sub tables 16 of the holder stand 14 are disposed in the direction of transfer by the inside transfer robot 18 with clearances between one another, the wafer holder 30 can be passed to the holder stand 14 as shown in FIG. 11 by inserting the distal end arm 18c into the clearances between the four sub stands 16. In this process, since the receiving members 15b of the main stands 15 have the steps 15a, the wafer holder 30 can be supported at the accurate position by the steps 15a.

Figure 12:
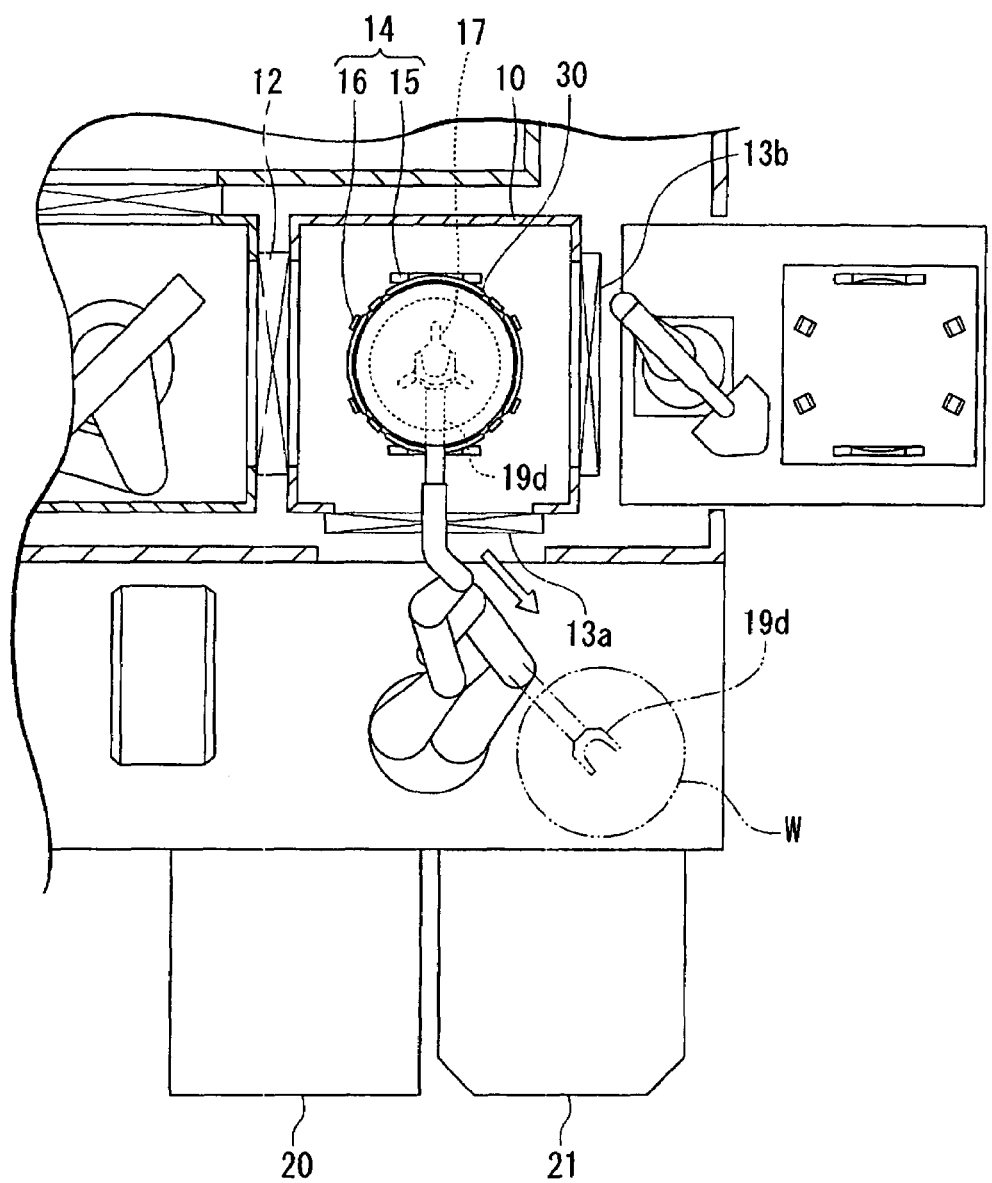
FIG. 12 illustrates the focusing ion beam apparatus in the embodiment according to the invention.
Figure 13:
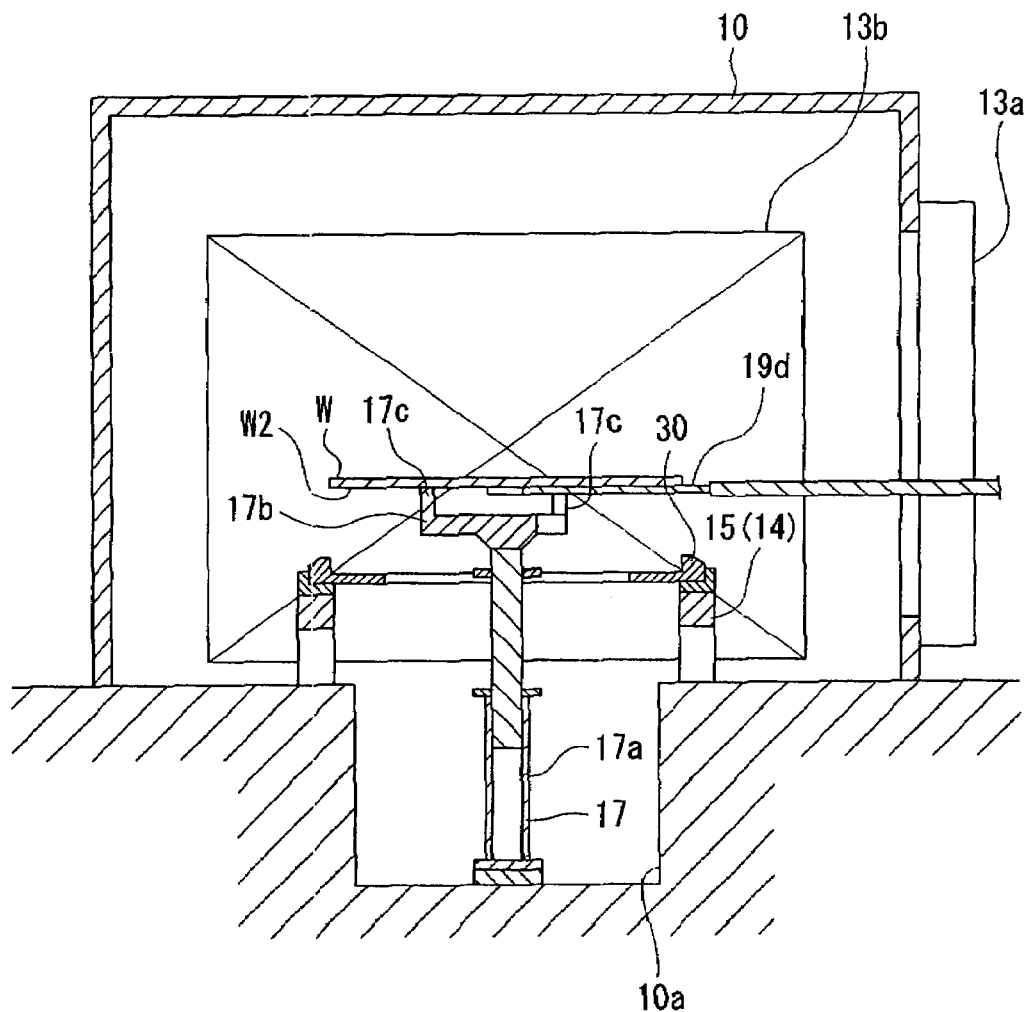
FIG. 13 is a cross-sectional view of the holder chamber in the focusing ion beam apparatus in the embodiment according to the invention.

Subsequently, the wafer W and the cross section sample S held by the wafer holder 30 is transferred from the holder chamber 10 to the outside. In this process, the gate valve 12 is closed and then the outside valve 13 is opened. By this method, the vacuum condition of the robot chamber 9 can be maintained. As illustrated in FIGS. 12 and 13, the wafer W held by the wafer holder 30 is initially transferred to the outside. More specifically, the cylinder 17a of the elevator 17 is expanded to raise the supporting pins 17c. Since the wafer holder 30 has the opening 31a at its center, the supporting pins 17c thus raised contact a lower surface W2 of the wafer W. Then, the supporting pins 17c are further raised to lift the wafer W and separate the wafer W from the wafer holder 30. Thereafter, the wafer transfer robot 19 is actuated to insert the distal end arm 19d of the wafer transfer robot 19 into the space below the wafer W lifted by the elevator 17 so that the distal end arm 19d contacts the lower surface W2. By this method, the wafer W can be passed to the wafer transfer robot 19 to be transferred to the outside. The wafer W having reached the outside is stored in the wafer cassette 21 which accommodates wafers after production of cross section samples S.

Figure 14:
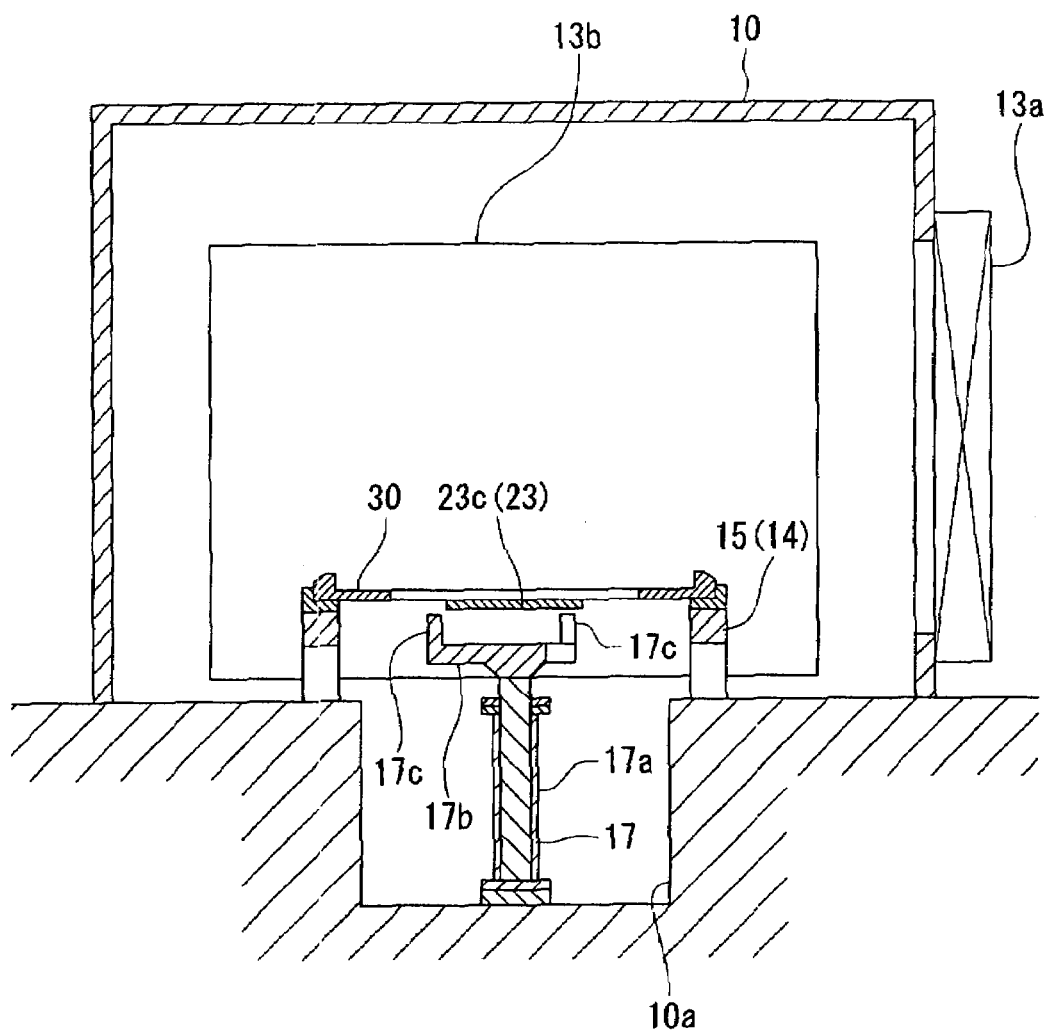
FIG. 14 is a cross-sectional view of the holder chamber in the focusing ion beam apparatus in the embodiment according to the invention.
Figure 15:
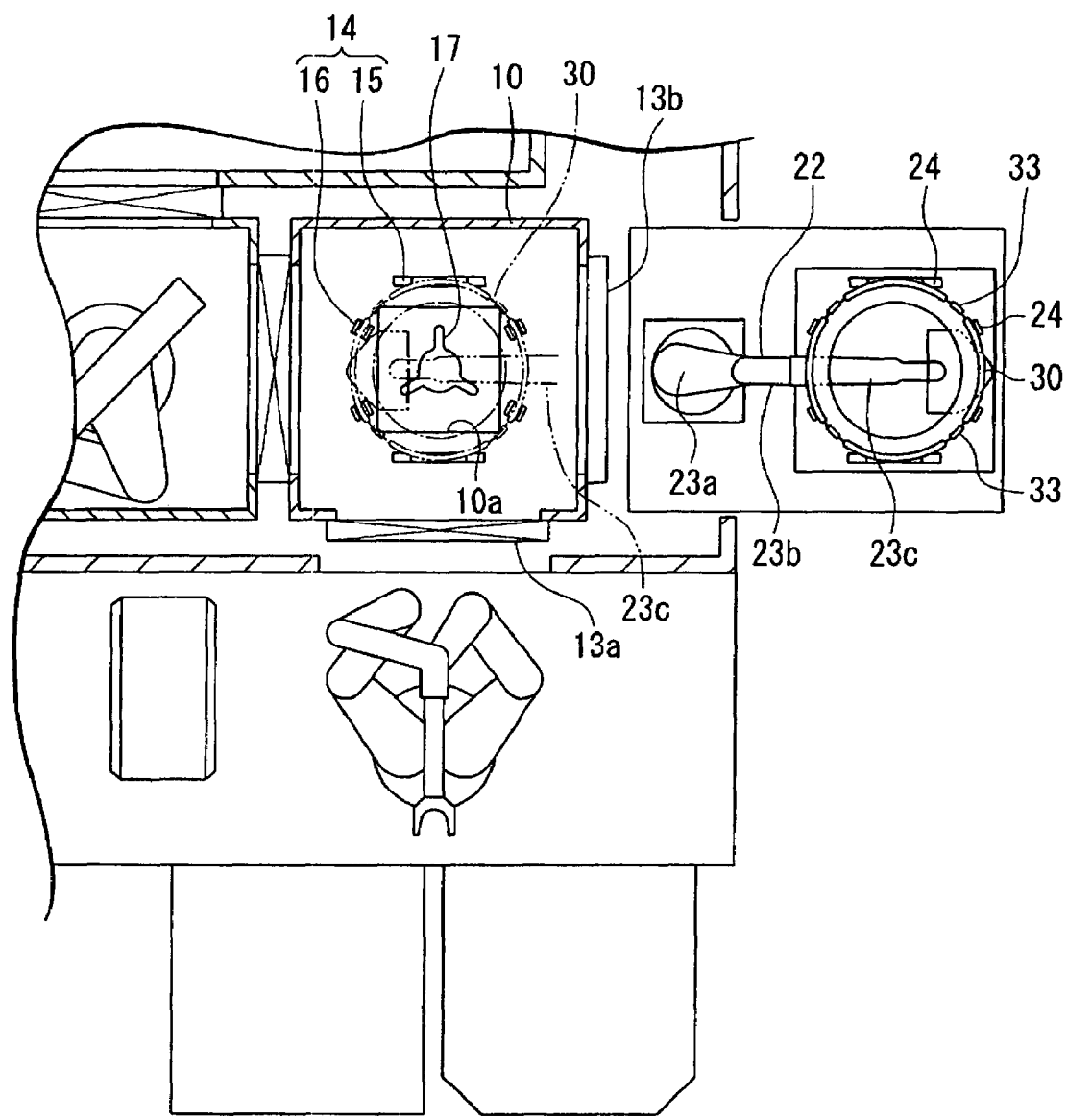
FIG. 15 illustrates the focusing ion beam apparatus in the embodiment according to the invention.

Subsequently, the cylinder 17a of the elevator 17 is contracted to lower the supporting pins 17c as illustrated in FIG. 14. Then, the wafer valve 13a is closed and the holder valve 13b is opened. As illustrated in FIGS. 14 and 15, the holder transfer robot 23 is actuated under this condition, and the distal end arm 23c is inserted into the clearances between the sub stands 16 in the holder chamber 10 so as to bring the distal end arm 23c into contact with the lower surface 31d of the holder main body 31 of the wafer holder 30. Then, the wafer holder 30 holding the cross section sample S on the sample holding member 33 is transferred to the holder carrier 24 disposed outside by shifting the distal end arm 23c. After the wafer holder 30 is transferred to the outside, the cross section sample S is treated by the unit of the sample cassette 34 having been removed from the holder main body 31 of the wafer holder 30, and therefore the cross section sample S is stored or transferred to the transmission electron microscope for observation by the unit of the sample cassette 34. Since each sample stand 36 to which one piece of the cross section sample S is fixed can be attached to and detached from the sample cassette 34 via the fixing stand 35, it is possible to detach the fixing stand 35 from the sample cassette 34 and handle the cross section sample S by the unit of the fixing stand 35. After observation of the produced cross section sample S is completed, the sample stand 36 is removed from the fixing stand 35. Then, a new piece of the sample stand 36 to which no cross section sample S is bonded is inserted into the fixing stand 35 and attached to the sample cassette 34. Thus, the fixing stand 36 can be again attached to the wafer holder 30 for use. It is possible that the sample cassette 34 is transferred to the next step while being held by the wafer holder 30 without being removed from the holder main body 31 of the wafer holder 30.

As illustrated in FIG. 1, when a cross section sample S is produced from a new wafer W, the wafer holder 30 is transferred from the holder carrier 24 to the holder stand 14 in the holder chamber 10 by the holder transfer robot 23. A new wafer W is taken out from the wafer cassette 20 by the wafer transfer robot 19, and the direction of the wafer W is detected by the wafer aligner 22. Then, the wafer W is transferred by the wafer transfer robot 19 with the supporting pins 17c of the elevator 17 raised in the holder chamber 10, and passed onto the supporting pins 17c of the elevator 17. Thereafter, the wafer W is easily positioned on the holder main body 31 of the wafer holder 30 and maintained thereon by lowering the elevator 17. The processes after this step are the reversed processes performed when the wafer W and the cross section sample S are transferred from the sample chamber 2 to the outside, and therefore explanation of these processes is not repeated herein.

In this embodiment, the wafer W is transferred one by on by using the wafer holder 30 to the sample chamber 2 where the cross section sample S is produced, and the wafer W and the cross section sample S are transferred by using the wafer holder 30 to the outside. However, the cross section sample S may be successively extracted from a plurality of pieces of wafer W. For example, one cross section sample S is extracted from one piece of wafer W, and this extraction is repeated for a plurality of pieces of wafer W. In this case, the cross section sample S is extracted from the first piece of wafer W, and the wafer W is transferred to the holder chamber 10 as illustrated in FIG. 9. When the wafer W is transferred to the outside as illustrated in FIG. 12, a new piece of wafer W is taken out from the wafer cassette 20 and placed on the wafer holder 30 without transferring the wafer holder 30 from the wafer valve 13b to the outside. Then, the wafer holder 30 holding the new wafer W and the cross section sample S previously extracted is transferred to the sample chamber 2 to extract the new cross section sample S from the new wafer W. Since the sample holding members 33 hold 16 pieces of cross section sample S in total in this embodiment, the cross section sample S can be successively extracted from 16 pieces of wafer W. According to this method, the processes for transferring the wafer holder 30 to the outside and extracting the cross section sample S for every piece of the wafer W are not performed, which achieves improvement over the throughput.

As discussed above, the sample chamber 2 which accommodates the wafer holder 30 holding the wafer W and produces the cross section sample S is made compact by using the small-sized and lightweight wafer holder 30. Moreover, since the transfer route is unified by transferring the wafer W and the cross section sample S simultaneously by using the wafer holder 30, the space necessary for the transfer can be reduced. Furthermore, since the small-sized and lightweight wafer holder 30 is used, the size of the inside transfer robot 18 for transferring the wafer holder 30 and thus the size of the corresponding load lock chamber 8 can be reduced. Since the sample chamber 2 and the load lock chamber 8 are made compact, evacuation of air in the sample chamber 2 and the load lock chamber 8 into vacuum can be improved and the entire size of the apparatus can be reduced.

Since the load lock chamber 8 is constituted by the robot chamber 9 and the holder chamber 10, evacuation of air in each of the sample chamber 2, the robot chamber 9 and the holder chamber 10 of the load lock chamber 8 into vacuum can be further enhanced. In addition, the throughput in the processes from transferring the wafer W to producing the cross section sample S and transferring the wafer W and the cross section sample S to the outside can be improved, because the wafer W is easily separated from the wafer holder 30 by raising the wafer W through the opening 31a of the holder main body 31 of the wafer holder 30 by the use of the elevator 17 together with the advantage that the wafer W and the cross section sample S are simultaneously transferred.

Since there are two routes passing through the wafer valve 13a and through the holder valve 13b in the transfer from the holder chamber 10 to the outside, the wafer W and the cross section sample S can be efficiently transferred to the outside without complication. In addition, the wafer transfer robot 19 for transferring the wafer W to the outside can be a separate mechanism from the holder transfer robot 23 for transferring the wafer holder 30 holding the cross section sample S to the outside. Thus, the wafer transfer robot 19 can be provided as a mechanism offering minute operations, while the holder transfer robot 23 can be provided as a mechanism capable of transferring a relatively heavy load compared with the wafer transfer robot 19 so as to efficiently transfer the wafer holder 30. Furthermore, since the wafer holder 30 and the wafer W are attracted and held by the first electrostatic chuck 3b and the second electrostatic chuck 3c of the sample stage 3 in the interior 2a of the sample chamber 2, completely automated transfer without requiring operation by the operator is achieved. In this case, resolution of the focusing ion beam I is also increased. Accordingly, the performance of the cross section sample manufacture is enhanced.

While the inside transfer robot 18, the wafer transfer robot 19, and the holder transfer robot 20 are used as mechanisms for transferring the wafer holder 30 in this embodiment, various other known robots may be selected according to the purposes. While the wafer holder 30 has the four sample cassettes 34 and the four fixing stands 35 provided for each of the sample cassettes 34, the numbers of the sample cassettes 34 and the fixing stands 35 attachable to each of the sample cassettes 34 may be changed if necessary. The fixing stands 35 may be directly fixed to the holder main body 31 without using the sample cassettes 34.

The invention is not limited to the embodiment described and depicted in detail herein with reference to the drawings. It is therefore to be understood that modification and changes in design and in other aspects may be given to the invention within the scope thereof.

What is claimed is:

1. A wafer holder, comprising:
   a frame-shaped holder main body which has an opening at its center and carries a wafer on its upper surface;
   a guide member which contacts the outer periphery of the wafer placed on the holder main body and positions the wafer on the holder main body; and
   a cross section sample holding member which is disposed on the outer circumference of the holder main body and holds a cross section sample produced from the wafer, the cross section sample holding member including a plate-shaped sample stand to which the cross section sample is fixed, and a fixing stand which is detachably attached to the holder main body and pinches the sample stand such that the sample stand is attachable to and detachable from the fixing stand.

2. A wafer holder according to claim 1, wherein the cross section sample holding member has a sample cassette engaging with the outer circumference of the holder main body such that the sample cassette is attachable to and detachable from the holder main body, and a plurality of the fixing stands engage with the sample cassette such that the fixing stands are attachable to and detachable from the sample cassette.

3. A sample producing apparatus, comprising:
   a wafer holder according to claim 1;
   a sample chamber for accommodating the wafer holder holding the wafer and evacuating inside air into vacuum;
   a charged particle beam tube for producing the cross section sample by applying charged particle beam to the wafer accommodated in the interior of the sample chamber and etching the wafer;
   extraction and transfer means for extracting the produced cross section sample from the wafer and transferring the extracted cross section sample to the sample stand of the wafer holder;
   bonding means for bonding the cross section sample to the sample stand; and
   a load lock chamber which is connected with the sample chamber via an openable and closable sample chamber valve and connected with the outside via an openable and closable outside valve, and evacuates air inside the load lock chamber into vacuum, the load lock chamber containing a holder stand on which the wafer holder is disposed with a space below the wafer holder, an elevator disposed below the wafer holder placed on the holder stand for lifting the wafer held by the wafer holder by moving upward and downward, and an inside transfer robot for transferring the wafer holder between the holder stand and the interior of the sample chamber.

4. A sample producing apparatus according to claim 3, wherein the outside valve in the load lock chamber includes a wafer valve for transferring the wafer between the load lock chamber and the outside, and a holder valve for transferring the wafer holder between the load lock chamber and the outside.

5. A sample producing apparatus according to claim 3, wherein the load lock chamber includes a holder chamber containing the holder stand and the elevator and a robot chamber containing the inside transfer robot, and the holder chamber and the robot chamber are connected with each other via an openable and closable gate valve, and air inside the holder chamber and the robot chamber is independently evacuated into vacuum.

6. A sample producing apparatus according to claim 3, further comprising a sample stage for supporting the wafer holder in the interior of the sample chamber which includes a first electrostatic chuck having a frame shape corresponding to the shape of the holder main body of the wafer holder to attract and hold the holder main body, and a second electrostatic chuck projecting upward from the inside of the first electrostatic chuck to attract and hold the wafer placed on the holder main body attracted and held by the first electrostatic chuck.

* * * * *